US010066295B2

(12) United States Patent
Lee et al.

(10) Patent No.: US 10,066,295 B2
(45) Date of Patent: Sep. 4, 2018

(54) SOURCE CONTAINER AND VAPOUR-DEPOSITION REACTOR

(71) Applicant: UNITEX CO., LTD, Gyeonggi-do (KR)

(72) Inventors: Myung Gi Lee, Gyeonggi-do (KR); Yong Eui Lee, Gyeonggi-do (KR); Un Jung Kim, Gyeonggi-do (KR)

(73) Assignee: UNITEX CO., LTD., Gyeonggi-do (KR)

( * ) Notice: Subject to any disclaimer, the term of this patent is extended or adjusted under 35 U.S.C. 154(b) by 485 days.

(21) Appl. No.: 14/388,764

(22) PCT Filed: Mar. 26, 2013

(86) PCT No.: PCT/KR2013/002496
§ 371 (c)(1),
(2) Date: Sep. 26, 2014

(87) PCT Pub. No.: WO2013/147491
PCT Pub. Date: Oct. 3, 2013

(65) Prior Publication Data
US 2015/0053134 A1 Feb. 26, 2015

(30) Foreign Application Priority Data
Mar. 28, 2012 (KR) ........................ 10-2012-0031891

(51) Int. Cl.
*B01F 3/02* (2006.01)
*B01F 5/00* (2006.01)
(Continued)

(52) U.S. Cl.
CPC .......... *C23C 16/45512* (2013.01); *B01F 3/02* (2013.01); *B01F 5/00* (2013.01);
(Continued)

(58) Field of Classification Search
CPC ..... B01B 1/05; B01D 1/06–1/14; B01D 7/00; B01F 3/02; B01F 3/04;
(Continued)

(56) References Cited

U.S. PATENT DOCUMENTS 529,684 A * 11/1894 Rogers ................... F02M 21/00
128/200.11
2,437,963 A * 3/1948 Irving Langmuir ........................
B01F 3/04014
159/900

(Continued)

FOREIGN PATENT DOCUMENTS

JP 2009-059871 3/2009
JP 2011-054789 3/2011
(Continued)

OTHER PUBLICATIONS

International Search Report dated Jul. 1, 2013 for PCT/KR2013/002496.
(Continued)

*Primary Examiner* — Jeffrie Robert Lund
*Assistant Examiner* — Stanislav Antolin

(57) ABSTRACT

The present invention relates to a source container and to a vapor-deposition reactor. The source container according to one embodiment of the present invention comprises: a container comprising an inner wall for delimiting a first space for holing a source material, and a second space which is adjacent to the first space and is for the mixing of vapor emitted from the source material and a carrier gas taken into the inside thereof; a carrier gas inflow pathway which connects the outside of the container second space; a mixed gas discharge pathway which connects the outside of the container and the second space; and a flow-limiting member which expands inside the second space, and provides a first (Continued)

flow barrier surface between the inflow port and the discharge port.

20 Claims, 9 Drawing Sheets

(51) Int. Cl.
- *C23C 14/22* (2006.01)
- *C23C 14/24* (2006.01)
- *C23C 16/44* (2006.01)
- *C23C 16/448* (2006.01)
- *C23C 16/455* (2006.01)

(52) U.S. Cl.
CPC .......... *C23C 14/228* (2013.01); *C23C 14/243* (2013.01); *C23C 16/4402* (2013.01); *C23C 16/4481* (2013.01); *C23C 16/45502* (2013.01)

(58) Field of Classification Search
CPC .............. B01F 3/04007–3/04014; B01F 3/04049–3/04063; B01F 3/04099–3/04978; B01F 3/04241–3/04269; B01F 2003/04283–2003/04347; B01F 2003/04354–2003/04404; B01F 3/06; B01F 3/063; B01F 5/00; C23C 14/228; C23C 14/243; C23C 16/4402; C23C 16/4481; C23C 16/448–16/452; C23C 16/45502; C23C 16/45512; C23C 16/45561; C30B 25/14; F17C 9/02

See application file for complete search history.

(56) References Cited

U.S. PATENT DOCUMENTS

| | | | | |
|---|---|---|---|---|
| 3,459,668 A * | 8/1969 | Schmit | ................... | C30B 31/08 252/62.3 R |
| 3,767,172 A * | 10/1973 | Mills | ................... | F02M 25/00 123/25 R |
| 4,212,663 A * | 7/1980 | Aslami | ................... | C03B 37/01413 118/724 |
| 4,947,790 A * | 8/1990 | Gartner | ................... | C23C 16/4481 118/715 |
| 5,224,202 A * | 6/1993 | Arnold | ................... | C23C 16/4483 392/389 |
| 5,538,625 A * | 7/1996 | Sigaud | ................... | C10G 9/002 208/127 |
| 5,554,220 A * | 9/1996 | Forrest | ................... | C23C 16/30 117/102 |
| 6,202,991 B1 * | 3/2001 | Coniglio | ................... | B01F 3/04248 128/203.12 |
| 6,210,485 B1 * | 4/2001 | Zhao | ................... | C23C 16/4481 118/715 |
| 6,270,839 B1 * | 8/2001 | Onoe | ................... | C23C 16/4481 118/726 |
| 6,337,102 B1 * | 1/2002 | Forrest | ................... | C23C 14/12 427/255.23 |
| 6,635,114 B2 * | 10/2003 | Zhao | ................... | C23C 16/4402 118/715 |
| 8,554,064 B1 * | 10/2013 | Dinh | ................... | B01D 1/08 392/386 |
| 2003/0033984 A1 * | 2/2003 | Carpenter | ................... | C23C 16/455 118/725 |
| 2003/0098516 A1 * | 5/2003 | Zhang | ................... | H01M 8/04223 261/127 |
| 2003/0116019 A1 * | 6/2003 | Torkaman | ................... | B01F 3/022 95/226 |
| 2003/0188638 A1 * | 10/2003 | Zhang | ................... | B01F 5/0603 96/294 |
| 2003/0192471 A1 * | 10/2003 | Jurgensen | ................... | C23C 14/12 117/89 |
| 2003/0222360 A1 * | 12/2003 | Randive | ................... | C23C 16/4481 261/128 |
| 2004/0124265 A1 * | 7/2004 | Kaelberer | ................... | B01F 3/04049 239/338 |
| 2005/0000427 A1 * | 1/2005 | Lee | ................... | C23C 16/4481 118/715 |
| 2005/0217575 A1 * | 10/2005 | Gealy | ................... | C23C 16/4481 118/715 |
| 2005/0249649 A1 * | 11/2005 | Hubbell | ................... | B01D 5/0096 422/228 |
| 2005/0287299 A1 * | 12/2005 | Ahn | ................... | C23C 14/12 427/248.1 |
| 2006/0219168 A1 * | 10/2006 | Brcka | ................... | C23C 16/4481 118/715 |
| 2007/0079759 A1 * | 4/2007 | Lee | ................... | C23C 16/4482 118/715 |
| 2007/0087130 A1 * | 4/2007 | Arai | ................... | C23C 14/04 427/457 |
| 2010/0112215 A1 * | 5/2010 | Cuvalci | ................... | C23C 16/4482 427/255.28 |
| 2011/0079179 A1 * | 4/2011 | Okura | ................... | C23C 16/405 118/726 |
| 2011/0171383 A1 * | 7/2011 | Woelk | ................... | B01B 1/005 427/255.23 |
| 2011/0275196 A1 * | 11/2011 | Eser | ................... | C23C 14/243 438/478 |
| 2013/0291797 A1 * | 11/2013 | Kusuhara | ................... | C23C 16/4481 118/726 |

FOREIGN PATENT DOCUMENTS

| | | | | |
|---|---|---|---|---|
| KR | 20020038625 A | * | 5/2002 | |
| WO | WO 2004-007793 | | 1/2004 | |
| WO | WO-2012086728 A1 | * | 6/2012 | ......... C23C 16/4481 |
| WO | WO 2013165173 A1 | * | 11/2013 | ........... C23C 14/228 |

OTHER PUBLICATIONS

Written Opinion of the International Search Report dated Jul. 1, 2013 for PCT/KR2013/002496.

* cited by examiner

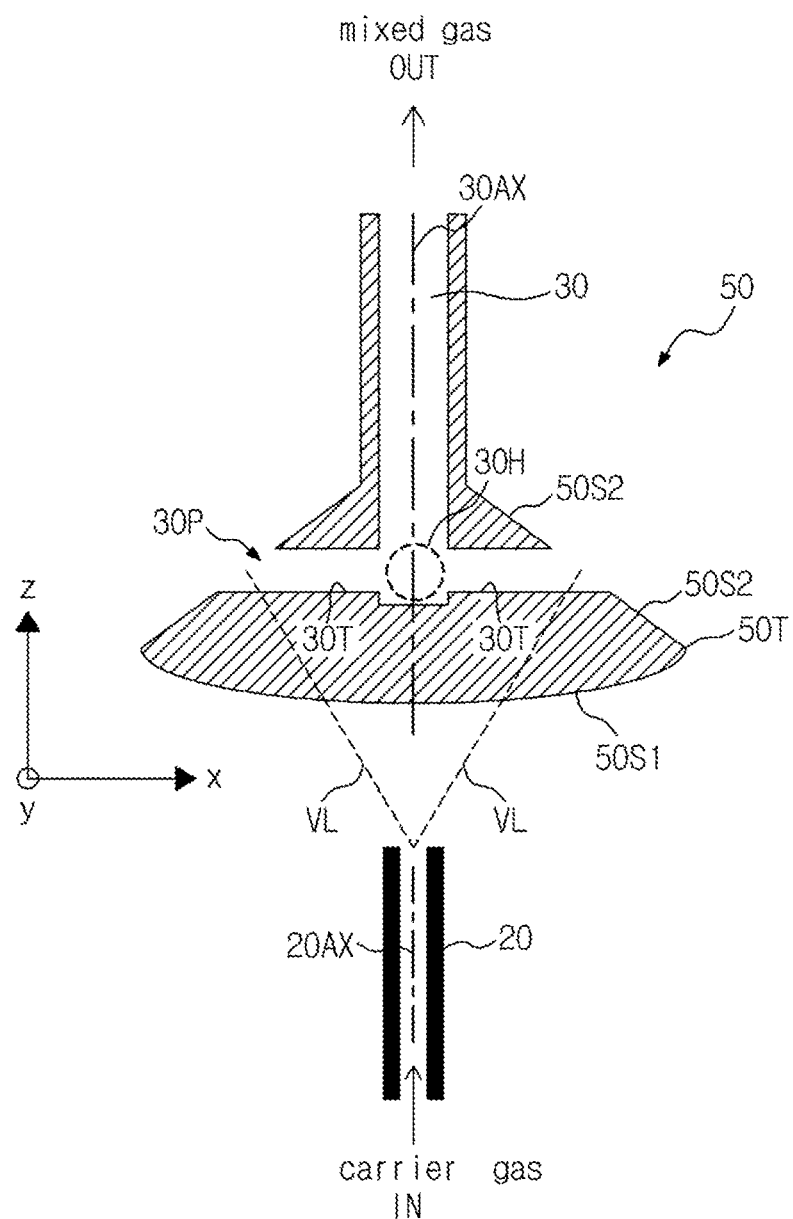

SOURCE CONTAINER AND VAPOUR-DEPOSITION REACTOR

This application claims the priority of Korean Patent Application No. 10-2012-0031891, filed on Mar. 28, 2012 in the KIPO (Korean Intellectual Property Office), the disclosure of which is incorporated herein entirely by reference. Further, this application is the National Stage application of International Application No. PCT/KR2013/002496, filed Mar. 26, 2013, which designates the United States and was published in Korean. Each of these applications is hereby incorporated by reference in their entirety into the present application.

TECHNICAL FIELD

The present invention relates to a vapour-deposition technique, and more particularly, a source container for generating a vapour precursor and a vapour-deposition reactor including the same.

BACKGROUND ART

In a semiconductor fabricating apparatus or a display manufacturing apparatus, a reactor for forming a thin-film via a vapour deposition method, such as a chemical vapour deposition (CVD), an atomic layer deposition (ALD), or an organic vapour deposition (condensing coating), often employs a separately arranged source container. A solid or liquid phase source may be inserted into the source container, a vapour precursor is formed within the source container by heating the source, and the vapour precursor may be carried to the reactor by a suitable carrier gas.

Generally, a solid phase source is widely preferred for its stability. However, due to heat sensitivity as well as low vapour pressure, vapour-deposition using a solid phase source exhibits various technical problems, such as non-uniformity in amount of carried vapour precursor or precipitation of the same.

DISCLOSURE OF THE INVENTION

Technical Problem

Embodiments of the present invention include a source container capable of resolving problems including non-uniformity amount of carried vapour precursor or precipitation of the same, controlling temperature uniformity and flow of carried vapour precursor, and removing particles to secure reproducibility of film formation.

Embodiments of the present invention also include a reactor for vapour-deposition including a source container having the advantages as stated above.

Technical Solution

According to an aspect of the present invention, there is provided a source container including a container including inner walls for defining a first space for accommodating a source material SM and a second space adjacent to the first space wherein carrier gas introduced thereinto and vapour generated from the source material are mixed; a carrier gas introducing path communicating inside and outside of the container and including an introduction port exposed in the second space; a mixed gas discharging path communicating inside and outside of the container and including a discharging port exposed inside in the second space; and a flow restricting member expanding in the second space and providing a first flow barrier surface between the introduction port and the discharging port.

The first flow barrier surface may include a surface expanding across a virtual straight path defined as a straight line interconnecting the center of the introduction port and the center of the discharging port in the second space. Furthermore, the first flow barrier surface may include a flat surface, a curved surface, a polyhedral surface, or a combination thereof.

The first flow barrier surface may be apart from the inner walls defining the second space. Furthermore, the source container may further include a second flow barrier surface expanding from an expanded end portion of the first flow barrier surface to the central axis of the mixed gas discharging path.

The source container may further include via holes communicating to flow path center end portion of the mixed gas discharging path and being formed at the second flow barrier surface, and the discharging port may be defined by the via holes. Furthermore, a crossing angle between the first flow barrier surface and the second flow barrier surface may be within a range from 20° to 70°. The second flow barrier surface may expand in a tilted direction.

The central axis of the carrier gas introducing path and the central axis of the mixed gas discharging path may be arranged on a same line. The carrier gas introducing path may extend from outside of the container to the second space via the first space. The mixed gas discharging path may extend from outside of the container to the second space via the first space.

The source container may further include a nozzle including via holes communicating with the flow path combined with the carrier gas introducing path. Furthermore, via holes may be arranged to jet the carrier gas toward a surface of the source material. Furthermore, the nozzle may include a blocked surface facing the first flow barrier surface.

The source material is a liquid or a solid, and the source material may exhibit a vapour pressure from about $10^{-6}$ Torr to about $10^3$ Torr at a temperature range from about 50° C. to about 550° C. The source material may include organic molecules, a conjugated polymer, an organic metal complex or an inorganic source material.

According to an aspect of the present invention, there is provided a vapour-deposition reactor coupled with the mixed gas discharging path of the source container. The vapour-deposition reactor is for fabrication of an organic light emitting diode (OLED).

Advantageous Effects

According to embodiments of the present invention, due to flow barrier surfaces arranged between an introduction port and a discharging port, a gas flow distance between the introduction port and the discharging port in a second space becomes longer than a virtual straight path. Therefore, it becomes easier for carrier gas to be mixed with vapour generated from a source material. Furthermore, since hot carrier gas exhibits a laminar pattern along the first flow barrier surface, temperature consistency inside a container is improved. Thus, cold spots in the container may be removed or reduced. As a result, particles condensed or incompletely decomposed at cold spots may be suppressed, and amount of vapour precursor carried to the reactor may be maintained constant.

Furthermore, since a first flow barrier surface and, selectively, a second flow barrier surface are arranged, even if particles are formed inside the second space due to the cold spots, the particles are absorbed or reflected by the first flow barrier surface and the second flow barrier surface, and thus introduction of the particles to a discharging port may be blocked. As a result, defects due to the particles may be prevented in a fabricated device.

BRIEF DESCRIPTION OF THE DRAWINGS

FIGS. 3A and 3B are magnified sectional views of flow paths and 30 and the flow restricting members inside a second space, according to another example of the present invention;

MODE FOR CARRYING OUT THE INVENTION

Figure 1A:
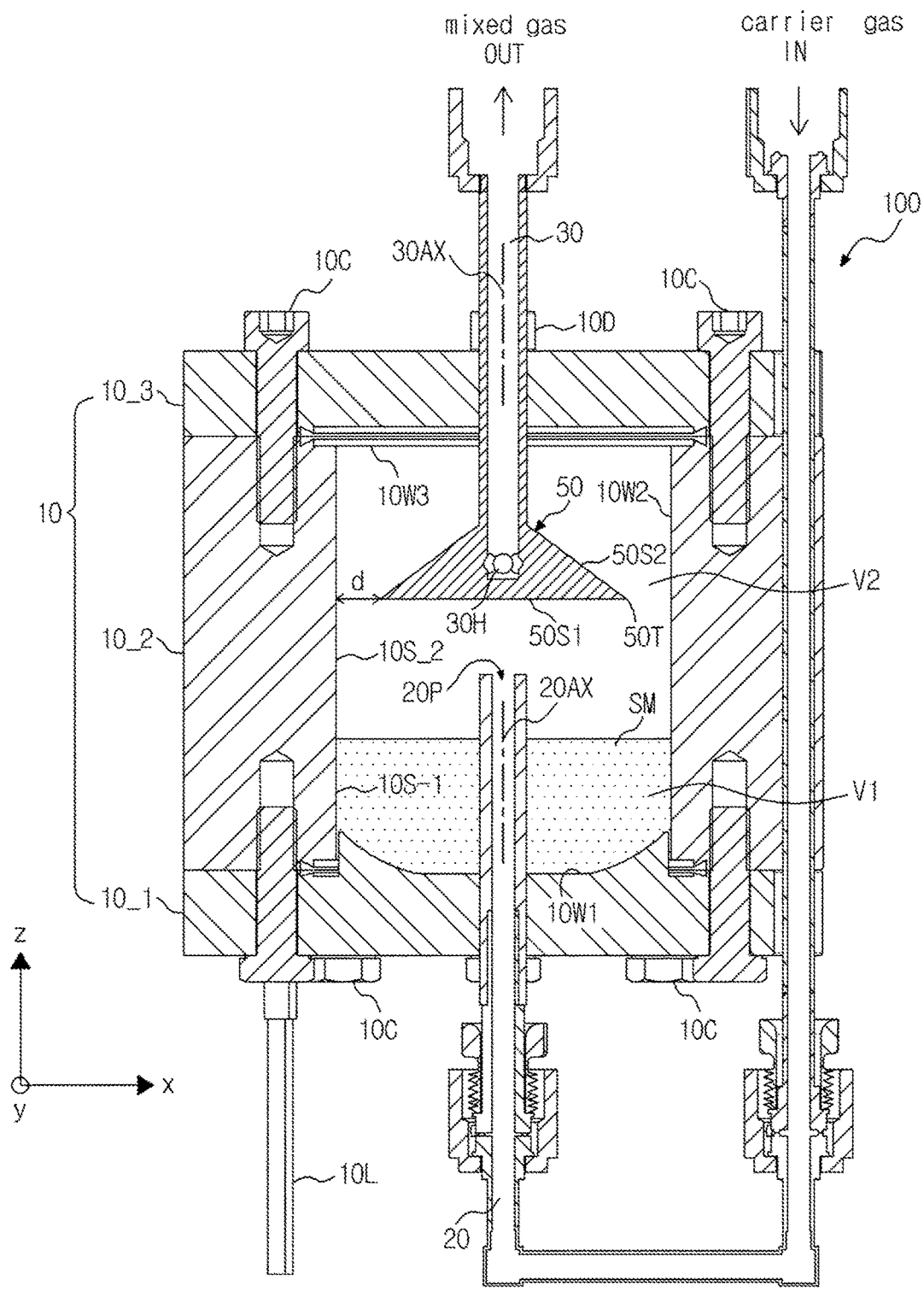
FIGS. 1A and 1B are sectional views of a source container, obtained in different view angles around the same center axis.

The present invention will now be described more fully with reference to the accompanying drawings, in which exemplary embodiments of the invention are shown.

The invention may, however, be embodied in many different forms and should not be construed as being limited to the embodiments set forth herein; rather these embodiments are provided so that this disclosure will be thorough and complete, and will fully convey the concept of the invention to one of ordinary skill in the art. Meanwhile, the terminology used herein is for the purpose of describing particular embodiments only and is not intended to be limiting of exemplary embodiments.

Also, thickness or sizes of layers in the drawings are exaggerated for convenience of explanation and clarity, and the same reference numerals denote the same elements in the drawings. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention Inside a heated source container, a space for accommodating a source material (referred to hereinafter as a 'first space') and a space adjacent to the first space for mixing vapour generated from the source material with a carrier gas (referred to hereinafter as a 'second space') may be thermally uniform. However, the inventors of the present invention found that there might be cold spots in the first space and the second space, and at the cold spots, vapour of the source material might be condensed or incompletely decomposed and generate particles. Therefore, based on the above-stated facts, the inventors have confirmed that the cold spots may be suppressed and a mixed gas without particles may be effectively obtained by controlling flow of a carrier gas that is heated to a high temperature and introduced into a source container. Particularly, such a flow control is effective for a solid or liquid organic source material that is heat-sensitive and suitable for vapour-deposition mechanism. A source material suitable for a source container according to the present invention is a liquid or solid material exhibiting a vapour pressure from about $10^{-6}$ Torr to about $10^{3}$ Torr at a temperature range from about 50° C. to about 550° C. and may be organic molecules, a conjugated polymer, an organic metal complex or an inorganic source material suitable for vapour-deposition, e.g., $C_{27}H_{18}AlN_3O_3$(ALQ$_3$ and N, N'-Bis(naphthalene-1-yl)-N,N-bis(phenyl)benzidine (NPB).

Figure 1B:
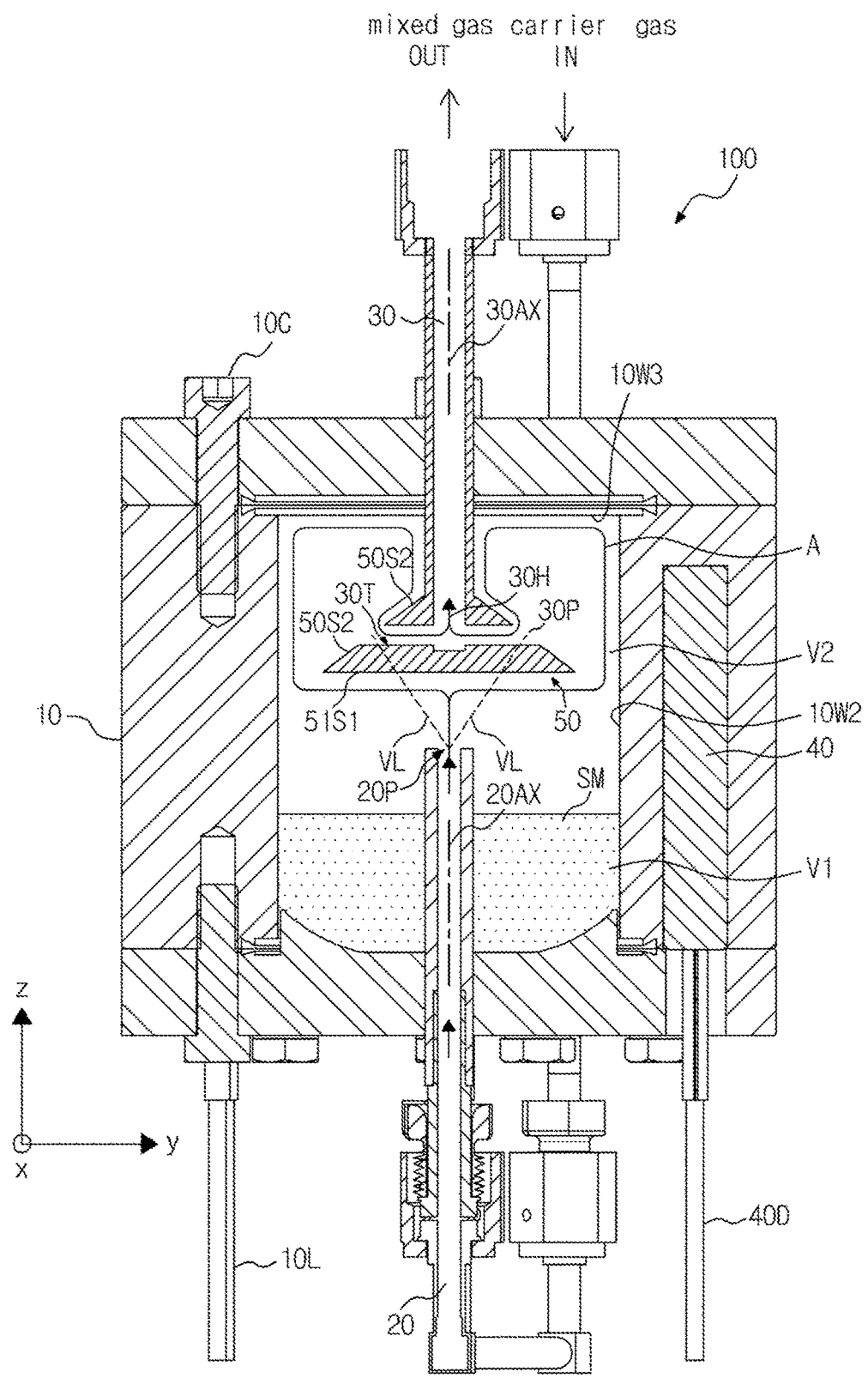

FIGS. 1A and 1B are sectional views of a source container 100, obtained in different viewing angles around the same center axis 20AX and 30AX. Directions are indicated via the orthogonal coordinate system, where the y-axis direction indicates a direction perpendicular to the ground.

Referring to FIGS. 1A and 1B, the source container 100 may include a container 10 and flow paths 20 and 30 for communicating inside and outside of the container 10. The container 10 may have a cylindrical shape with the center axis along the z-axis direction. However, the present invention is not limited thereto, and the container 10 may have an elliptical shape or a spherical shape having axis in horizontal directions (x-axis direction or y-axis direction) or a vertical direction (z-axis direction).

The container 10 may consist of a plurality of parts, where the plurality of parts may be attached/detached to/from one another for introduction of a source material SM and periodical cleaning. For example, as shown in FIGS. 1A and 1B, the container 10 may include three independent parts including a bottom unit 10_1, a body unit 10_2, and a cap unit 10_3. Alternatively, the bottom unit 10_1 and the body unit 10_2 of the container 10 may be integrated in one body. However, the number of parts constituting the container 10 is merely an example, and the present invention is not limited thereto. For example, the container 10 may include four or more independent parts. The parts may be combined with one another and maintain mechanical coupling strength via coupling members 10C, such as bolts/nuts, joints, and/or clamps, and maintain a mechanical combination strength or screw-combination or flange structure between the parts or may require a sealing member 10D for maintaining air-tightness.

The container 10 may be partially or entirely formed of a material selected from among metals, e.g., stainless steel, aluminum, titanium, copper, etc., a transparent material for observing the interior like crystal or glass, one from among insulation materials like ceramic materials, or a combination thereof. However, the present invention is not limited thereto According to one example of the present invention, the inner walls 10W1, 10W2, and 10W3 of the respective parts 10_1, 10_2, and 10_3 of the container 10 may define a first space V1 accommodating source material SM and a second space V2 contacting the first space V1 as shown in FIG. 1A, wherein a carrier gas introduced into the container 10 and vapour generated from the source material are mixed in the second space V2. The first space V1 is a space where the source material SM may be accumulated, whereas the second space V2 is a space to be filled with vapour, which includes a vapour precursor generated from the source material SM as the source material SM is vapourized and/or sublimated.

Hereinafter, inner walls of the container 10 defining the first space V1 will be referred to as first inner walls, whereas inner walls of the container 10 defining the second space V2 will be referred to as second inner walls. For example, in the source container 100, first inner walls 10S_1 may include the entire inner wall 10W1 of the bottom unit 10_1 and a portion of the inner wall 10W2 of the body unit 10_2 contacting the source material SM, whereas second inner walls 10S_2 may include a portion of the inner wall 10W2 of the body unit 10_2 not contacting the source material SM and the entire inner wall 10W3 of the cap unit 10_3.

The source container 100 may further include a heating member controlled by a temperature controller for supplying heat into the container 10. The heating member may heat the first space V1 filled with the source material SM or, optionally, heat the second space V2 filled with a gas together. For example, the heating member may be a resistive heater 40 as shown in FIG. 1B.

The resistive heater 40 may penetrate through the bottom unit 10_1 and the body unit 10_2 and be buried inside the container 10, for example. The resistive heater 40 may be connected to a power source (not shown) controlled via a wire 10L. The resistive heater 40 may heat both the first space V1 and the second space V2. According to another example of the present invention, the independent resistive heaters 40 may be provided to heat the first space V1 and the second space V2, respectively. The number of the resistive heater as shown in FIG. 1B is merely an example, and two or more resistive heaters may be buried inside the container 10 at a constant interval distance. According to another example of the present invention, the resistive heater 40 may be provided outside the container 10 or inside the container 10. Detailed descriptions thereof will be given below with reference to FIG. 7.

However, the resistive heater 40 is merely an example of the heating members, and the present invention is not limited thereto. For example, the heating member may be any of other heating members, such as a radiant heater, a fluid circulating heater, and an induction heater. Furthermore, although not shown, other suitable temperature sensors for measuring temperatures of the spaces V1 and V2 inside the container 10 or temperature of the container 10, such as a thermoelectric couple, a thermistor, or an infrared ray heat detecting sensor, may be arranged. Particularly, for the infrared ray heat detecting sensor, an optically transparent window may be provided at the container 10.

A carrier gas introducing path 20 and a mixed gas discharging path 30 of the source container 100 communicates the second space V2 to outside of the container 10. A carrier gas may be introduced into the second space V2 via the carrier gas introducing path 20 (carrier gas IN). The carrier gas is a gaseous fluid for carrying vapour precursor of the source material SM from the source container 100 to a reactor for deposition process. The carrier gas may be an inert gas such as helium, nitrogen, and argon, or a reactive gas, such as oxygen, ozone, and carbon dioxide, which is heated and supplied to prevent condensation of a source material.

The carrier gas introduced into the second space V2 is mixed with vapour of the source material SM dispersed into the second space V2 and a mixed gas is carried to the reactor via the mixed gas discharging path 30 (mixed gas OUT). The reactor may be applied to a vapour-deposition apparatus for fabricating a semiconductor element, such as a memory or a logic circuit, or to a reactive product thereof or a vapour-deposition apparatus for manufacturing a display device like an organic EL (or an organic light emitting diode (OLED)), for example, which have an element layer formed via deposition of vapour generated from a liquid or solid source material. However, it is merely an example, and the reactor may be applied to other photoelectric devices based on a source material SM, e.g., an electrochemical battery, a photoconductive battery, a photo resistor, a photo switch, a photo transistor, and a photo tube. The disclosure of Electronics and Nucleonics Dictionary (Markus, John; 1966 edition; pages 470 through 476; McGraw-Hill, Inc. 1966) may be referred for detailed descriptions of the above-stated terminologies.

According to examples of the present invention, as shown in FIGS. 1A and 1B, the carrier gas introducing path 20 may pass through the first space V1 from outside and may extend to the second space V2. In this case, an introduction port 20P of the carrier gas introducing path 20 may protrude above the surface of source material SM and may be exposed to the second space V2. However, according to another example of the present invention, the carrier gas introducing path 20 may directly extend from outside to the second space V2.

In terms of flowing direction of a fluid, the source container 100 shown in FIGS. 1A and 1B is an upstream flow type, because the carrier gas introducing path 20 is located at a relatively low position than the mixed gas discharging path 30 at a standard level of a surface of the source material SM. To embody the upstream flow type, the introduction port 20P of the carrier gas introducing path 20 is not limited to the shown configuration of passing through the first space V1 and extending into the second space V2, and the introduction port 20P of the carrier gas introducing path 20 may also be arranged lower than a discharging port 30P at a standard level of a surface of the source material SM.

The source container 100 may include a flow restricting member 50 inside the second space V2. According to an example of the present invention, the flow restricting member 50 may be combined with the mixed gas discharging path 30 as shown in FIG. 1a. To this end, the flow restricting member 50 may be attached to a portion of the mixed gas discharging path 30, e.g., an end portion of the mixed gas discharging path 30, via a coupling member, such as welding, a screw, or bolt/nut, or may be integrated as an one body with a portion of the mixed gas discharging path 30.

As described above, as an example that the flow restricting member 50 is combined with the mixed gas discharging path 30, the flow restricting member 50 may be provided as a 3-dimensional structure that surrounds a flow path center end portion 30H on the central axis (30AX of FIG. 2A) in the extending direction of the mixed gas discharging path 30, where an end portion 50T of the flow restricting member 50 is a distance d apart from the second inner walls 10S_2. The structure may be screwed or welded to the flow path center end portion 30H. According to another example of the present invention, although not shown, various modifications may be made in configuration and coupling of the flow restricting member 50, and the present invention is not limited thereto. For example, the flow restricting member 50 may consist of a plurality of parts or may be machined to be integrated into one body with the mixed gas discharging path 30.

As described above, when the flow restricting member 50 surrounds the flow path center end portion 30H of the mixed gas discharging path 30, the discharging port 30P of the mixed gas discharging path 30 may be provided by a via hole 30T inside the flow restricting member 50 communicating with the flow path center end portion 30H. There may be a single via hole 30T or a plurality of via holes 30T, where detailed descriptions thereof will be given below.

The flow restricting member 50 includes a first flow barrier surface 50S 1 arranged between the introduction port 20P and the discharging port 30P, where the first flow barrier surface 50S1 may be a surface of the structure. The first flow barrier surface 50S1 may be arranged to cross the central axis 20AX of the carrier gas introducing path 20. According to an example of the present invention, the first flow barrier surface 50S1 is a surface extending inside the second space V2 across virtual linear paths VL1 and VL2, which are defined as straight lines interconnecting the center of the introduction port 20P and the center of the discharging port 30P. The first flow barrier surface 50S1 may be a 2-dimensional flat surface expanding in the x-axis direction and y-axis direction as shown in FIGS. 1A and 1B.

According to an example of the present invention, the flow restricting member 50 may further include a second flow barrier surface 50S2 expanding from an extended end portion 50T of the first flow barrier surface 50S 1 to the central axis 30AX of the mixed gas discharging path 30. As shown in FIGS. 1A and 1B, the second flow barrier surface 50S2 may be a sloped surface expanded in a tilted direction, where the first flow barrier surface 50S1 and the second flow barrier surface 50S2 may provide a cone-like structure including the surfaces as the bottom surface and the side surface of the cone-like structure, respectively. The via holes 30T formed in the second flow barrier surface 50S2 communicate with the flow path center end portion 30H and, as described above, the discharging port 30P of the mixed gas discharging path 30 may be defined by the via holes 30T.

As shown in FIG. 1B, a gas flow distance from the introduction port 20P to the discharging port 30P inside the second space V2 may be elongated more than virtual straight paths VL1 and VL2 due to the first flow barrier surface 50S1, where, as indicated by the arrow A, hot carrier gas introduced from the introduction port 20P may exhibit a gas flow pattern of moving to the second inner wall 10W2 of the source container 100 along the first flow barrier surface 50S1 and reaching the discharging port 30P along the second inner wall 10W2 via a gap having a width d between the second inner wall 10W2 and the first flow barrier surface 50S1. Preferably, the gas flow pattern may be a high temperature laminar flow pattern based on hot carrier gas. However, the used term 'high temperature laminar pattern' does not exclude a turbulent flow or a transition flow that may occur in the second space V2.

According to an example of the present invention, due to an increased gas flow distance, it may be easier for hot carrier gas introduced from the introduction port 20P to be mixed with vapour of a source material dispersed into the second space V2 before the hot carrier gas reaches the discharging port 30P, and, due to the high temperature flow pattern, temperature uniformity throughout the second space V2 may be improved. Accordingly, cold spots may be removed or reduced in the second space V2. Therefore, particles which may be condensed or incompletely decomposed at cold spots can be suppressed, and amount of vapour precursor carried to the reactor may be maintained constant during deposition process.

Furthermore, as another important advantage of the source container 100 according to an example of the present invention, since the first flow barrier surface 50S 1 and, optionally, the second flow barrier surface 50S2 are arranged, even if particles are generated inside the second space V2 due to the unexpected cold spots, the particles are absorbed or reflected by the first flow barrier surface 50S 1 and the second flow barrier surface 50S2, and thus introduction of the particles to the discharging port 30P may be blocked. As a result, defects due to the particles may be prevented in a manufactured device.

Figure 2A:
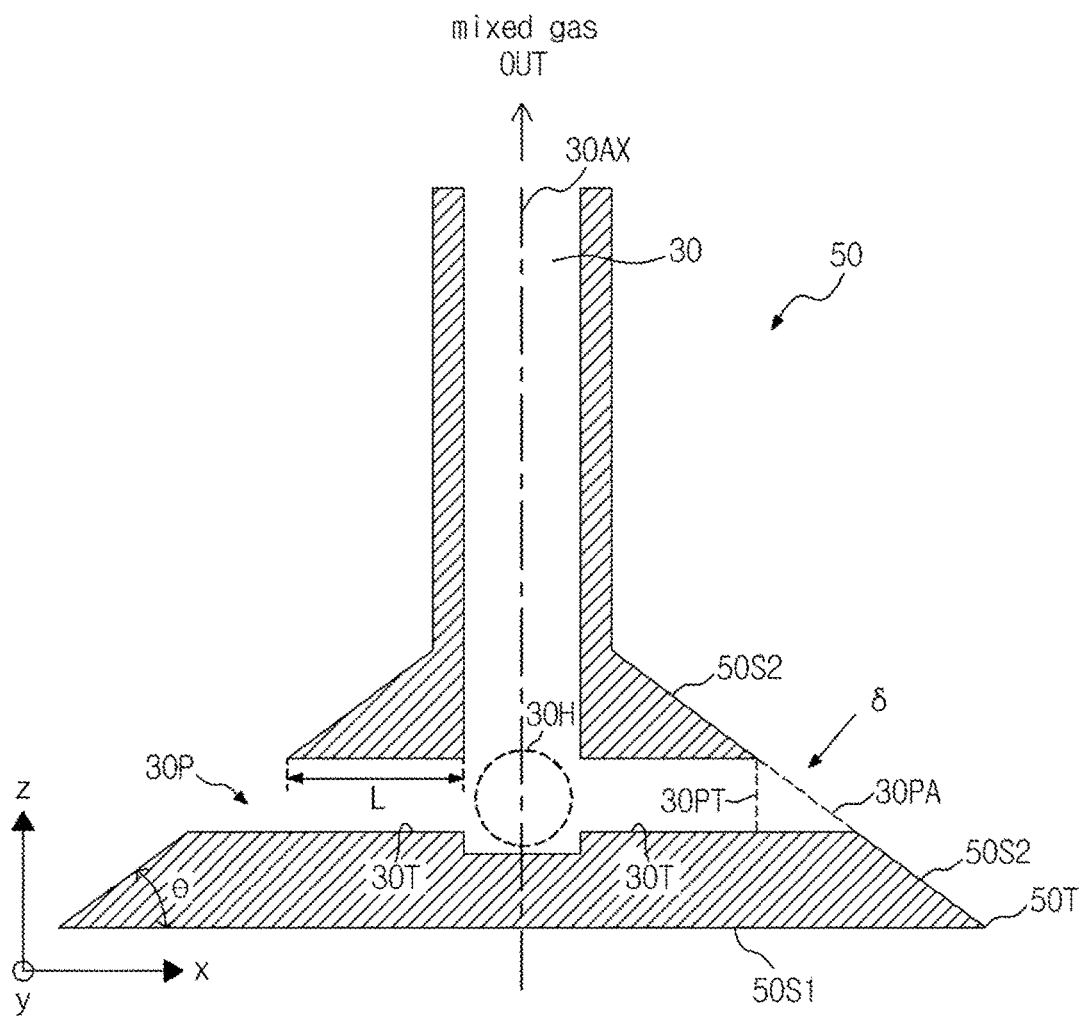
FIG. 2A is a magnified sectional view of a mixed gas discharging path of the source container shown in FIG. 1B and a flow restricting member combined thereto.
Figure 2B:
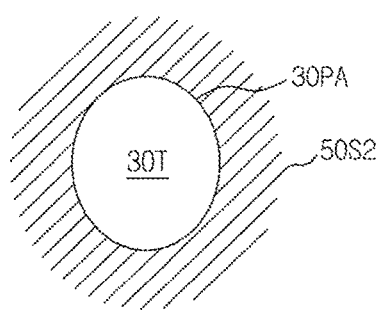
FIG. 2B is a diagram showing the shape of the discharging port of the flow restricting member viewed in a direction γ.

FIG. 2A is a magnified sectional view of the mixed gas discharging path 30 of the source container 100 shown in FIG. 1B and the flow restricting member 50 combined thereto, and FIG. 2B is a diagram showing the shape of the discharging port 30P of the flow restricting member 50 viewed in a direction γ.

Referring to FIG. 2A, the first flow barrier surface 50S 1 of the flow restricting member 50 inside a second space (V2 of FIG. 1B) may be a flat surface extending in the x-axis direction and the y-axis direction. Furthermore, as described above with reference to FIG. 1B, the flow restricting member 50 may further include the second flow barrier surface 50S2 extending toward the central axis 30AX of the mixed gas discharging path 30 from the extended end portion 50T of the first flow barrier surface 50S 1. Although the second flow barrier surface 50S2 may expand in a sloped direction as shown in FIG. 2A, it is merely an example, and the second flow barrier surface 50S2 may have a convex or concave curved surface or a polyhedral surface, similar to the first flow barrier surface 50S 1.

The discharging port 30P of the mixed gas discharging path 30 may be defined by via holes 30T communicating the second flow barrier surface 50S2 to the flow path center end portion 30H. Due to via holes 30T, the mixed gas discharging path 30 is substantially extended. As shown in FIG. 2A, via holes 30T may be formed around the central axis 30AX of the mixed gas discharging path 30 at the interval of 180°. In this case, the number of via holes 30T may be 2. However, it is merely an example. Three or more via holes 30T or only one via hole 30T may be formed around the central axis 30AX. In this case, the numbers of the discharging ports 30P may be vary in correspondence thereto.

Figure 3B:
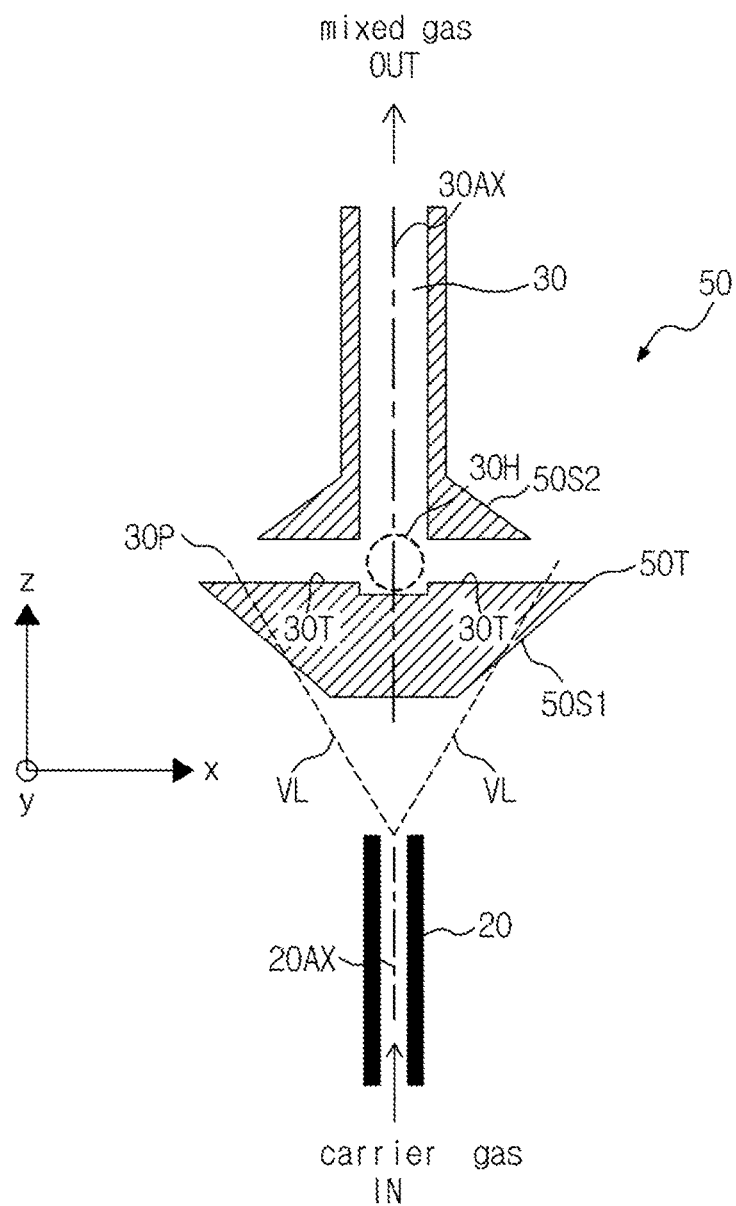

Referring to FIG. 2B as well as FIG. 2A, a crossing angle θ between the first flow barrier surface 50S 1 and the second flow barrier surface 50S2 (an inner angle between lines extending from the surfaces when the lines cross each other) is an acute angle and, if a cross-section 30PT of the via hole 30T has a circular shape, according to such a crossing angle θ, shape of the via hole 30T (referred to hereinafter as an exposed cross-section; 30PA) viewed in the direction γ perpendicular to a second flow barrier surface 30S2 may be similar to an elliptical shape. In this case, area of the exposed cross-section 30PA approximates to area of the cross-section 30PT of the discharging port 30P divided by sin θ. For example, as the crossing angle θ decreases, area of the exposed cross-section 30PA of the discharging port 30P increases. Furthermore, as the crossing angle θ decreases, a distance between the discharging port 30P and the flow path center end portion 30H may decrease. As a result, flux of a discharge gas carried to the mixed gas discharging path 30 via the discharging port 30P may increase. The crossing angle θ may be from 20° to 70°, for example. However, it is merely an example, and the crossing angle θ may be 90° or greater FIGS. 3A and 3B are magnified sectional views of flow paths 20 and 30 and the flow restricting members 50 inside a second space, according to another example of the present invention. Unless being contradictory, descriptions of the components shown in FIGS. 2A and 2B may be referred to for components denoted by reference numerals identical to those shown in FIGS. 2A and 2B, and any repeated descriptions will be omitted.

Referring to FIG. 3A, a first flow barrier surface 50S1 of the flow restricting member 50 may be a convex curved surface expanding across the virtual linear paths VL1 and VL2 toward the carrier gas introducing path 20 inside the second space V2. Furthermore, the flow restricting member 50 may further include a second flow barrier surface 50S2 expanding from the extended end portion 50T of the first flow barrier surface 50S1 toward the central axis 30AX of the mixed gas discharging path 30. The via holes 30T for communicating the second flow barrier surface 50S2 to the flow path center end portion 30H may be provided, thereby defining the discharging port 30P of the mixed gas discharging path 30. As described above, via holes 30T are formed around the central axis 30AX of the mixed gas discharging path 30 at the interval of 180°. However, it is merely an example, and three or more via holes 30T or only one via hole 30T may be formed around the central axis 30AX

Referring to FIG. 3B, the first flow barrier surface 50S 1 of the flow restricting member 50 according to another example of the present invention may be a polyhedral surface convexly expanding toward the carrier gas introducing path 20 inside the second space V2. Furthermore, the flow restricting member 50 may further include the second flow barrier surface 50S2 expanding from the extended end portion 50T of the first flow barrier surface 50S 1 toward the central axis 30AX of the mixed gas discharging path 30. The via holes 30T communicating from the second flow barrier surface 50S2 to the flow path center end portion 30H may define the discharging port 30P of the mixed gas discharging path 30.

Although the first flow barrier surface 50S1 is a curved surface or a polyhedral surface according to the examples shown in FIGS. 3A and 3B, various modifications may be made to control area of the first flow barrier surface 50S1 to control gas flow inside the second space V2. Furthermore, although the extended end portion 50T of the first flow barrier surface 50S1 continuously expands toward the central axis 30AX in a tilted direction in the examples shown in FIGS. 3A and 3B, it is merely an example, and the present invention is not limited thereto. For example, as described above, the second flow barrier surface 50S2 may extend to cross the first flow barrier surface 50S1 at a crossing angle equal to or greater than 90°, or the first flow barrier surface 50S1 and the second flow barrier surface 50S2 may be provided separately.

As shown in FIGS. 1A and 1B, the flow restricting member 50 according to an example of the present invention is coupled with the mixed gas discharging path 30. As shown in FIGS. 3A and 3B, the mixed gas discharging path 30 may be provided at the flow restricting member 50. According to another example of the present invention, the mixed gas discharging path 30 may be separately arranged to penetrate through a portion of a container, e.g., the cap unit 10_3, and to be exposed inside the second space V2, where the flow restricting member 50 may be coupled with an end portion of the mixed gas discharging path 30 via insert-fixation, screwed, bolt/nut fixation, or any of known attachment methods.

Although the central axis of a carrier gas introducing path and the center axis of a mixed gas discharging path are on the same line in the examples described above with reference to FIGS. 1A through 3B, it is merely provided as an example, and the present invention is not limited thereto. For example, the central axis may be offset from each other or may not be parallel to each other. However, for simplification of design, the central axis may be coincident to each other and components may be symmetrical around the central axis.

Figure 4:
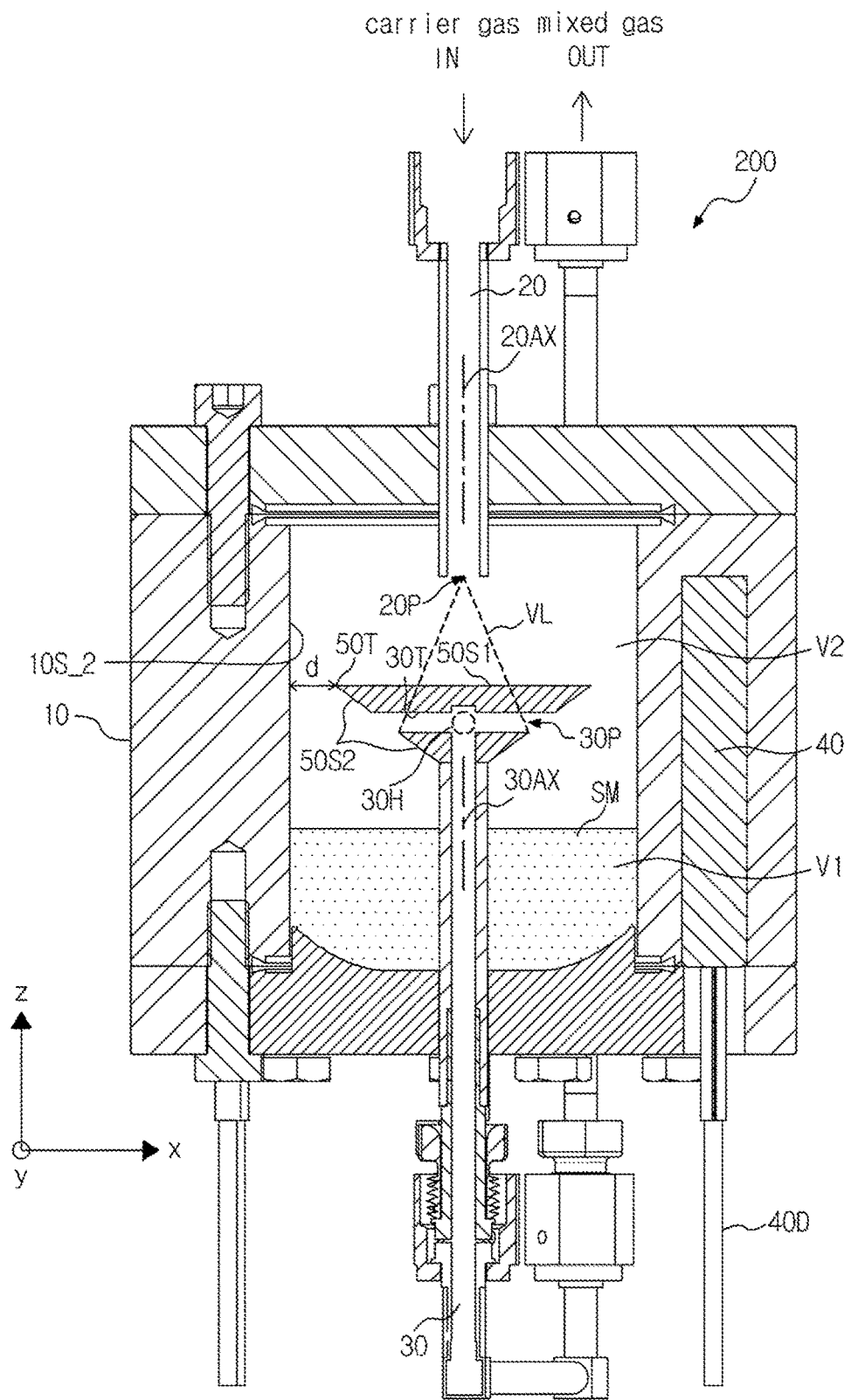
FIG. 4 is a sectional view of a source container according to another example of the present invention.

FIG. 4 is a sectional view of a source container 200 according to another example of the present invention. Unless being contradictory, descriptions of the components may be referred to for components denoted by reference numerals identical to the above-stated components, and any repeated descriptions will be omitted.

Referring to FIG. 4, the source container 200 is a downstream flow type in which the carrier gas introducing path 20 is located at a relatively high position than the mixed gas discharging path 30 at a standard level of a surface of the source material SM. It is a difference from the above-stated source container (100 of FIG. 1A).

The container 10 may consist of a plurality of parts, where inner walls of the parts may define the first space V1 and the second space V2. The carrier gas introducing path 20 and the mixed gas discharging path 30 communicate inside and outside of the source container 200. According to example of the present invention, as shown in FIG. 4, the mixed gas discharging path 30 may extend from outside of the container 10 to the second space V2 via the first space V1. However, it is merely an example, and the mixed gas discharging path 30 may also extend to the second space V2 without passing through the first space V1.

The source container 200 may include the flow restricting member 50 inside the second space V2. According to an example of the present invention, as shown in FIG. 4, the flow restricting member 50 may be provided as a 3-dimensional structure that surrounds a flow path center end portion 30H on the central axis 30AX in the extending direction of the mixed gas discharging path 30 and is a distance d apart from the second inner walls 10S_2. The structure may be screwed or welded to the flow path center end portion 30H. However, various modifications may be made in configuration and coupling of the flow restricting member 50, and the present invention is not limited thereto. For example, the flow restricting member 50 may consist of a plurality of parts or may be machined to be integrated in one body with the mixed gas discharging path 30 as shown in FIG. 4.

The first flow barrier surface 50S 1 of the flow restricting member 50 is arranged between the introduction port 20P and the discharging port 30P and crosses the central axis 20AX of the carrier gas introducing path 20. According to example of the present invention, the first flow barrier surface 50S 1 may expand across a virtual straight path VL inside the second space V2. As shown in FIG. 4, the first flow barrier surface 50S1 may be a 2-dimensional surface expanding in the x-axis direction and the y-axis direction. However, it is merely an example, and the first flow barrier surface 50S1 may be a 3-dimensional curved surface or a polyhedral surface with respect to the carrier gas introducing path 20 as shown in FIGS. 3A and 3B.

According to example of the present invention, the flow restricting member 50 may further include the second flow barrier surface 50S2 expanding from the extended end portion 50T of the first flow barrier surface 50S1 toward the central axis 30AX of the mixed gas discharging path 30. As shown in FIG. 4, the second flow barrier surface 50S2 may be a surface expanding in a sloped direction. However, it is merely an example, and, as described above, the second flow barrier surface 50S2 may be omitted or may cross the first flow barrier surface 50S1 at a crossing angle equal to or greater than 90°. The via holes 30T communicating with the flow path center end portion 30H may be provided at the second flow barrier surface 50S2, and the discharging port 30P of the mixed gas discharging path 30 may be defined by the via holes 30T.

A gas flow distance from the introduction port 20P to the discharging port 30P inside the second space V2 may be elongated more than a virtual straight path due to the first flow barrier surface 50S 1, where, as described above with reference to FIG. 1B, hot carrier gas introduced from the introduction port 20P may exhibit a gas flow pattern of moving along corresponding inner walls of a container and reaching the discharging port 30P. Preferably, the gas flow pattern may be a high temperature laminar flow pattern based on hot carrier gas. Due to the elongated gas flow distance, it may be easier for hot carrier gas introduced from the introduction port 20P to be mixed with vapour of a source material dispersed into the second space V2 before the hot carrier gas reaches the discharging port 30P, and, due to the high temperature flow pattern, temperature uniformity throughout the second space V2 may be improved. When temperature uniformity is improved, cold spots may be removed or reduced in the second space V2. Therefore, particles condensed or incompletely decomposed at cold spots may be suppressed, and amount of vapour precursor carried to the reactor may be maintained constantly.

Furthermore, since the first flow barrier surface 50S 1 and the second flow barrier surface 50S2 are arranged, even if particles are formed inside the second space V2 due to the cold spots, the particles are absorbed or reflected by the first flow barrier surface 50S 1 and the second flow barrier surface 50S2, and thus introduction of the particles to the discharging port 30P may be blocked. As a result, defects due to the particles may be prevented in a fabricated device.

Figure 5:
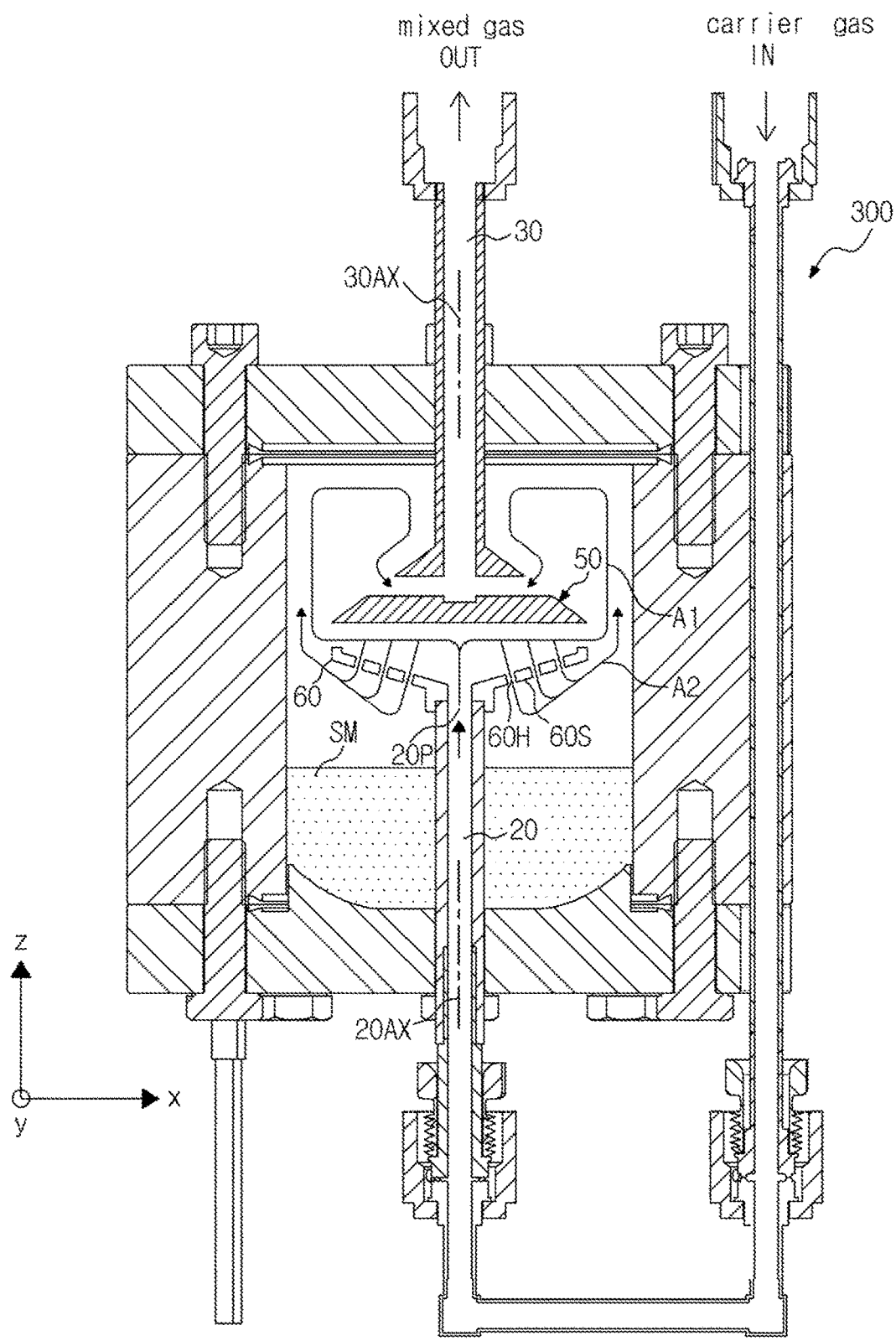
FIG. 5 is a sectional view of a source container according to another example of the present invention.

FIG. 5 is a sectional view of a source container 300 according to another example of the present invention. Unless being contradictory, descriptions of the components may be referred to for components denoted by reference numerals identical to the above-stated components, and any repeated descriptions will be omitted.

Referring to FIG. 5, the source container 300 is different from the source containers 100 and 200 described above for including a nozzle 60 coupled with the carrier gas introducing path 20. The nozzle 60 may include via holes 60H formed therein. A portion of a carrier gas jetted from the nozzle 60 flows to the discharging port 30P along the first flow barrier surface 50S1 of the flow restricting member 50 as indicated by the arrow A1, whereas the other portion of the carrier gas may be jetted toward the surface of the source material SM via the via holes 60H of the nozzle 60 and may flow to the discharging port 30P as indicated by the arrow A2.

The via holes 60H of the nozzle 60 may be arranged perpendicular to a surface of the source material SM, or may be tilted with respect to surface of the source material SM such that the carrier gas is jetted at a tilted angle as indicated by the arrow A2. To this end, the nozzle 60 may have a funnel-like shape expanding in tilted directions from the central axis 20AX of the carrier gas introducing path 20 in the propagation direction of the carrier gas, as shown in FIG. 5.

As described above, the nozzle 60 and the flow restricting member 50 provide a flow pattern regarding hot carrier gas introduced into the second space V2 from the introduction port 20P, thereby improving temperature uniformity inside the second space V2. Furthermore, generated particles are absorbed to or reflected by a surface 60S of the nozzle 60, and thus introduction of the particles into the discharging port 30P may be prevented.

Figure 6:
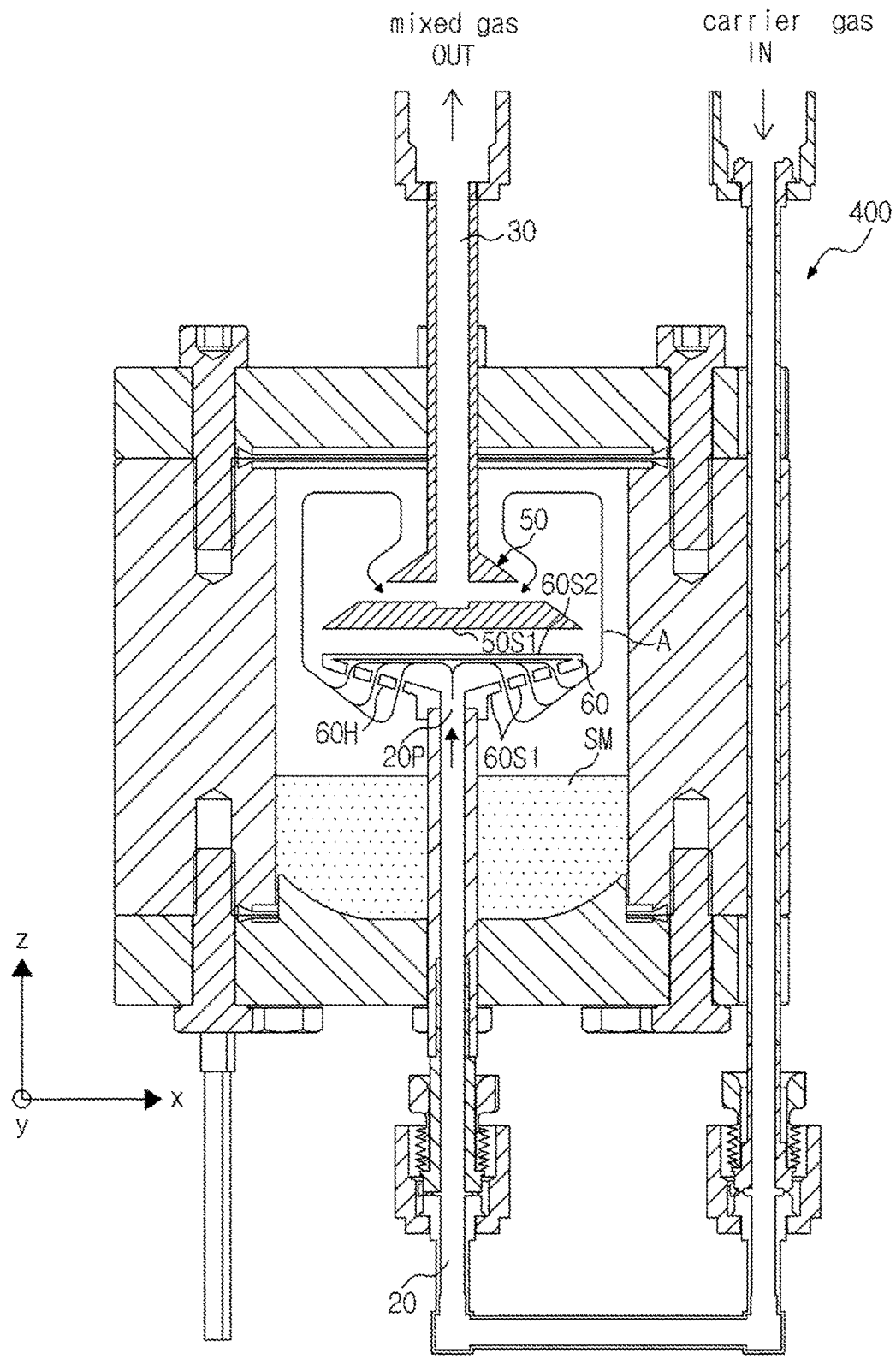
FIG. 6 is a sectional view of a source container according to another example of the present invention.

FIG. 6 is a sectional view of a source container 400 according to another example of the present invention. Unless being contradictory, descriptions of the components may be referred to for components denoted by reference numerals identical to the above-stated components, and any repeated descriptions will be omitted.

Referring to FIG. 6, the source container 400 is similar to the source container 300 shown in FIG. 5 that the nozzle 60 coupled with the carrier gas introducing path 20 includes the via holes 60H perpendicular to a surface of the source material SM, or arranged tilted with respect to surface of the source material SM such that the carrier gas is jetted at a tilted angle as indicated by the arrow A. However, a front surface (that is, a surface facing the first flow barrier surface 50S 1) of the nozzle 60 of the source container 400 has a blocked surface 60S2, and thus carrier gas is jetted through via holes 60H only. According to another example of the present invention, a via hole may be provided at the front surface of the nozzle 60 instead of a blocked surface.

Carrier gas from the nozzle 60 is jetted via the via holes 60H of the nozzle 60 toward a surface of the source material SM as indicated by the arrow A and then flows to the discharging port 30P. The hot carrier gas is mixed with vapour generated from a source material during propagation in the second space V2 and is discharged via the discharging port 30P.

The nozzle 60 and the flow restricting member 50 provide a flow pattern regarding hot carrier gas introduced into the second space V2 from the introduction port 20P, thereby improving temperature uniformity inside the second space V2. Furthermore, generated particles are absorbed to or reflected by the surface 60S of the nozzle 60, and thus introduction of the particles into the discharging port 30P may be prevented.

Although the nozzle 60 disclosed above with reference to FIGS. 5 and 6 relates to an upstream type source container, examples of the present invention are not limited thereto. For example, the nozzle as described above may be coupled with the carrier gas introducing path 20 in a source container as described above with reference to FIG. 4. Furthermore, as described above with reference to FIGS. 3A and 3B, the flow restricting members 50 of the source containers may have flow barrier surfaces including curved surfaces, polyhedral surfaces, or combinations thereof.

Figure 7:
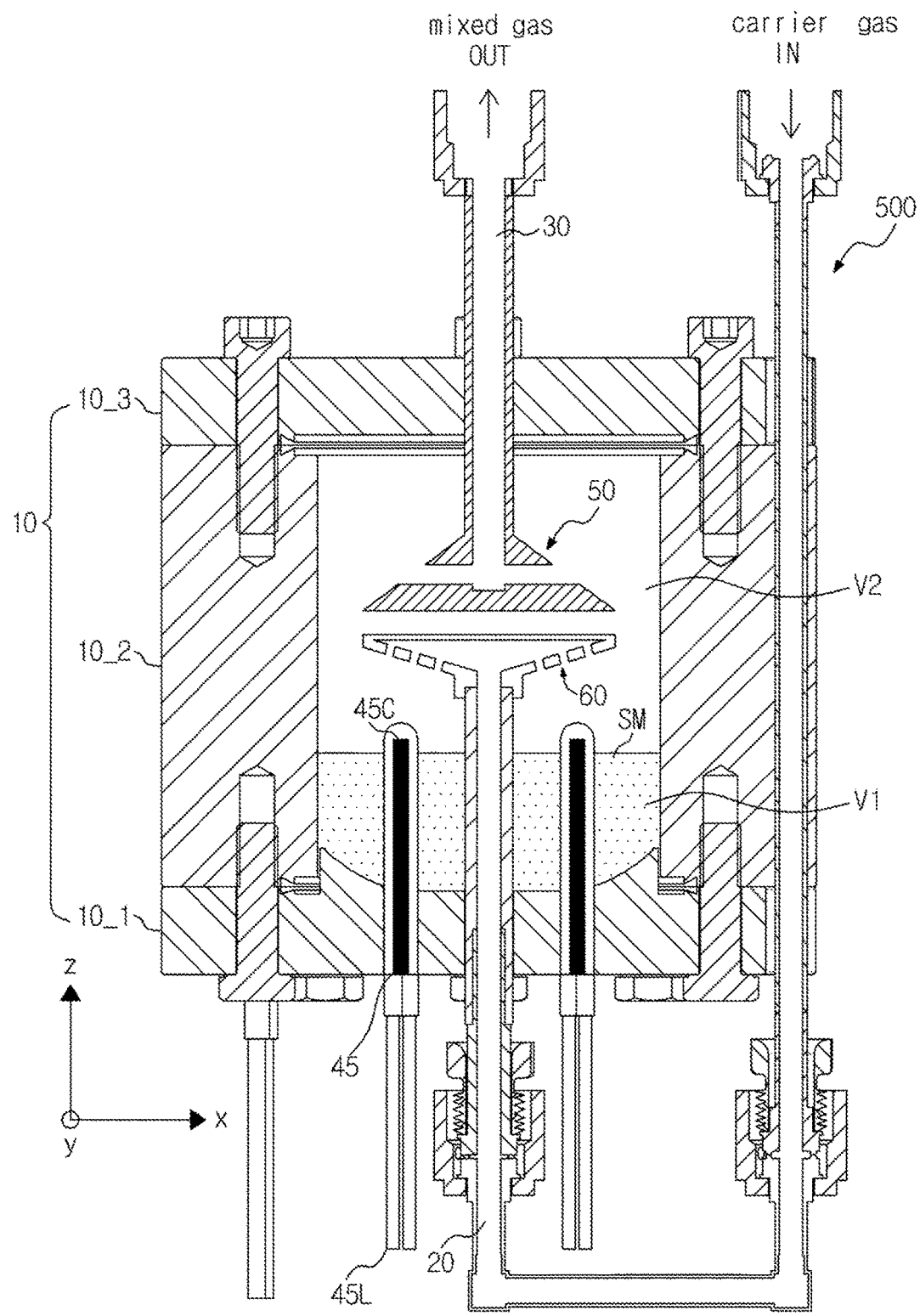
FIG. 7 is a sectional view of a source container according to another example of the present invention.

FIG. 7 is a sectional view of a source container 500 according to another example of the present invention. Unless being contradictory, descriptions of the components may be referred to for components denoted by reference numerals identical to the above-stated components, and any repeated descriptions will be omitted.

Referring to FIG. 7, unlike the source containers according to the example described above, the source container 500 may further include heating members 45 controlled by a temperature controller for supplying uniform heat to the interior of the container 10, e.g., first space V1.

The heating members 45 may have a rod-like shape extending in the z-axis direction and may be arranged in a 2-dimensional array shape expanding in the x-axis direction and the y-axis direction. The heating member 45 may be a resistive heater, for example, where a screening structure 45C may be provided to prevent the heating member 45 from directly contacting the source material SM in the first space V1.

The screening structure 45C may be integrated with the bottom unit 10_1 or may be assembled to penetrate through the bottom unit 10_1 and extend into the first space V1. The heating member 45 may not only be resistive heater, but also be any of other resistive heaters, such as a radiant heater, a fluid circulating heater, and an induction heater. Furthermore, according to another example of the present invention, the heating members 45 may not only have a rod-like shape, but also be linear, circular, or 2-dimensional surface heaters arranged in a concentric circular arrangement around the central axis of the carrier gas introducing path 20 or stacked in the z-axis direction in the first space V1. However, the present invention is not limited thereto Features and advantages of the above-stated examples may be replaced or combined with one another, and such modifications are within the scope of the present invention. For example, the heating member 45 shown in FIG. 7 may be applied to the upstream flow type source container shown in FIG. 4. Furthermore, the heating member 45 may replace the other heating member 40 shown in FIG. 1B or may be applied together with the heating member 40 to a source container.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A source container comprising:
   a container including inner walls for defining a first space for accommodating a source material and a second space adjacent to the first space wherein carrier gas introduced thereinto and vapour generated from the source material are mixed;
   a carrier gas introducing path communicating inside and outside of the container and comprising an introduction port exposed in the second space;
   a mixed gas discharging path communicating inside and outside of the container and comprising a discharging port exposed inside in the second space;
   a flow restricting member being combined with the mixed gas discharging path, expanding in the second space and providing a first flow barrier surface between the introduction port and the discharging port; and
   a nozzle including a surface with via holes communicating with the introduction port,
   wherein the carrier gas introducing path passes through the first space so that the introduction port is disposed under the first flow barrier surface,
   wherein the surface of the nozzle is disposed by being apart from the first flow barrier surface so that a portion of the carrier gas between the surface of the nozzle and the first flow barrier surface flows to the discharging port along the first flow barrier surface and other portion of the carrier gas is jetted through the via holes, wherein the surface of the nozzle is tilted toward the first flow barrier so that the other portion of the carrier gas is jetted at a tilted angle toward a surface of the source material.

2. The source container of claim 1, wherein the first flow barrier surface comprises a surface expanding across a virtual straight path defined as a straight line interconnecting the center of the introduction port and the center of the discharging port in the second space.

3. The source container of claim 1, wherein the first flow barrier surface comprises a flat surface, a curved surface, a polyhedral surface, or a combination thereof.

4. The source container of claim 1, wherein the first flow barrier surface is apart from the inner walls defining the second space.

5. The source container of claim 1, further comprising a second flow barrier surface expanding from an expanded end portion of the first flow barrier surface to the central axis of the mixed gas discharging path.

6. The source container of claim 5, wherein the discharging port comprises via holes that communicate with a flow path center end portion of the mixed gas discharging path, wherein the via holes are formed at the second flow barrier surface.

7. The source container of claim 5, wherein the first flow barrier surface and the second flow barrier surface form an angle, which is within a range from 20° to 70°.

8. The source container of claim 1, wherein the second flow barrier surface expands in a sloped direction from the first flow barrier surface.

9. The source container of claim 1, wherein the central axis of the carrier gas introducing path and the central axis of the mixed gas discharging path are arranged on a same line.

10. The source container of claim 1, wherein the carrier gas introducing path extends from outside of the container to the second space via the first space.

11. The source container of claim 1, wherein the mixed gas discharging path extends from outside of the container to the second space via the first space.

12. The source container of claim 1, further comprising a nozzle including via holes communicating with the flow path coupled with the carrier gas introducing path.

13. The source container of claim 12, wherein the via holes are arranged to jet the carrier gas toward a surface of the source material, which is accommodated in the first space.

14. The source container of claim 13, wherein the nozzle comprises a blocked surface facing the first flow barrier surface, wherein the blocked surface blocks the carrier gas flow toward the first flow barrier surface, whereby the carrier gas is jetted through the via holes only.

15. The source container of claim 13, further comprising a heating member inserted into the first space and controlled by a temperature controller.

16. The source container of claim 1, wherein the source material is a liquid or a solid.

17. The source container of claim 16, wherein the source material exhibits a vapour pressure from about 10-6 Torr to about 103 Torr at a temperature range from about 50° C. to about 550° C.

18. A vapour-deposition reactor coupled with the mixed gas discharging path of the source container of claim 1.

19. The vapour-deposition reactor of claim 18, wherein the vapour-deposition reactor is for fabrication of an organic light emitting diode (OLED).

20. A source container comprising:
a container including inner walls for defining a first space for accommodating a source material and a second space adjacent to the first space wherein carrier gas introduced thereinto and vapour generated from the source material are is mixed;
a carrier gas introducing path communicating inside and outside of the container and comprising an introduction port exposed in the second space;
a mixed gas discharging path communicating inside and outside of the container and comprising a discharging port exposed inside in the second space;
a flow restricting member being combined with the mixed gas discharging path, expanding in the second space and providing a first flow barrier surface between the introduction port and the discharging port; and
a nozzle including a surface with via holes communicating with the introduction port,
wherein the carrier gas introducing path passes through the first space so that the introduction port is disposed under the first barrier surface,
wherein the surface of the nozzle is disposed by being apart from the first flow barrier surface so that a portion of the carrier gas between the surface of the nozzle and the first flow barrier surface flows to the discharging port along the first flow barrier surface and other portion of the carrier gas is jetted through the via holes, and
wherein the surface of the nozzle is tilted toward the first flow barrier so that the other portion of the carrier gas is jetted at a tilted angle toward a surface of the source material,
wherein the first flow barrier surface comprises a curved surface or a polyhedral surface convexly expanding toward the carrier gas introducing path,
wherein a tilt angle of the curved surface or the polyhedral surface is smaller than an injection angle of the introduction port, based on a central axis of the mixed gas discharging path.

* * * * *